United States Patent [19]
Brunelle

[11] Patent Number: 6,058,055
[45] Date of Patent: May 2, 2000

[54] SYSTEM FOR TESTING MEMORY

[75] Inventor: Steven J. Brunelle, Boise, Id.

[73] Assignee: Micron Electronics, Inc., Boise, Id.

[21] Appl. No.: 09/053,403

[22] Filed: Mar. 31, 1998

[51] Int. Cl.[7] .................................................. G11C 7/00
[52] U.S. Cl. ........................................ 365/201; 371/21.2
[58] Field of Search ......................... 365/201; 391/21.1, 391/22.1; 395/183.01, 183.18

[56] References Cited

U.S. PATENT DOCUMENTS

| | | | |
|---|---|---|---|
| 3,644,899 | 2/1972 | Boisvert, Jr. ........................ | 395/183.01 |
| 3,681,757 | 8/1972 | Allen et al. ............................ | 371/21.1 |
| 3,758,759 | 9/1973 | Boisvert, Jr. et al. ................. | 371/21.1 |
| 4,066,880 | 1/1978 | Salley ................................... | 395/183.18 |
| 4,379,259 | 4/1983 | Varadi et al. ......................... | 395/183.08 |
| 4,456,995 | 6/1984 | Ryan ...................................... | 371/21.6 |
| 4,918,693 | 4/1990 | Ardini, Jr. et al. .................... | 371/21.6 |
| 5,654,204 | 8/1997 | Anderson . | |
| 5,794,175 | 8/1998 | Conner .................................. | 371/21.1 |
| 5,796,246 | 8/1998 | Poh et al. .............................. | 365/201 |
| 5,805,472 | 9/1998 | Fukasawa . | |
| 5,828,223 | 10/1998 | Rabkin et al. ......................... | 324/754 |
| 5,841,785 | 11/1998 | Suzuki ................................... | 365/201 |

*Primary Examiner*—David Nelms
*Assistant Examiner*—Gene N. Auduong
*Attorney, Agent, or Firm*—Knobbe, Martens, Olson & Bear, LLP

[57] ABSTRACT

A system for efficiently testing and diagnosing memory arrays. One embodiment of the testing system efficiently identifies faulty memory cells in a memory chip, and subsequently removes the memory chip containing the faulty memory cells from the testing process. The system includes a testing module and an active port list which includes an identifier for each of a plurality of memory chips.

20 Claims, 4 Drawing Sheets

SYSTEM FOR TESTING MEMORY

RELATED APPLICATIONS

The subject matter of the U.S. Patent Application entitled METHOD FOR TESTING A MEMORY CHIP IN MULTIPLE PASSES, filed concurrently herewith, application Ser. No. 09/053,496, and having attorney Docket Number MPATENT.104A contains related subject matter.

BACKGROUND OF THE INVENTION

1. Field of the Invention

The invention relates to the field of memory arrays. More particularly, the invention relates to a testing system for efficiently evaluating the operability of memory chips.

2. Description of the Related Technology

Substantially all modern electronic computers rely on semiconductor memory or memory chips to store data for processing by a central processing unit (CPU). Such computers employing memory chips vary from simple computers, such as those contained in telephone answering machines, to highly complex supercomputers employed for complicated scientific projects. The operability and functionality of these memory chips must be guaranteed after being manufactured. One or more defective memory locations in a memory of a computer used to perform scientific calculations may cause substantial problems.

Although current manufacturing techniques have substantially reduced the number of defective memory locations, excessive numbers of defective memory locations are still produced during the fabrication of computer memory. Those defective memory locations can be caused by an error in any of numerous steps taken during the manufacture of the memory chips such as is seen in semiconductor crystalinity defects and electrical connector discontinuities. Although memory chips with such defective memory locations typically represent a small portion (less than 1%) of the total number of memory chips produced, the actual number of such defective memory chips is substantial since computer manufacturers create many millions of memory chips each year.

Each memory chip includes a memory array, which is the area of the memory chip that stores bits of information. The array consists of rows and columns, with a cell at each intersection to store a bit. Manufacturers often use diagnostic programs to test each memory array before the array is shipped to the customers. These programs test the operability of each memory chip by writing a value into each memory cell and then reading the contents of that cell. If the value read from the memory cell is the same as that which was written into the memory cell, that particular memory cell is presumed to be functional.

FIGS. 1a and 1b are block diagrams illustrating the internals of some conventional memory chips. FIG. 1a illustrates a 4 Megabyte (M)×4 memory chip 100. The memory chip 100 has four memory arrays 102–108 each holding 4M of storage cells. The memory arrays 102–108 have 2048 rows and 2048 columns of memory cells. Each of four pins 110–116 allows access to one of the memory arrays 102–108. FIG. 1b illustrates a 2M×8 memory chip 118. The memory chip 118 has 8 memory arrays 120–126. The memory arrays 120–126 each hold 2M of memory. Each of the memory arrays 120–126 contains 1024 rows and 2048 columns of memory cells.

FIG. 2 is a diagram illustrating two traditional memory chip handlers 200. Since thousands of memory chips need to be tested, memory chip handlers have been created to manipulate the memory chips for testing. An example of a commercial handler is the Atrium M4300 by Simtek. The handlers 200 carry a plurality of memory chips 202. Each of the handlers 200 can typically hold up to 32 memory chips at one time 202.

The handlers 200 are both connected to a testing computer 204 which runs a series of diagnostic tests on the memory chips 202. An example of a testing computer 204 is the Mongoose J994 manufactured by Teradyne. The testing computer 204 performs such tests as applying a range of voltages to the memory chips 202 as well as performing several types of memory diagnostic tests. However, one problem with the current testing computers is that they run the diagnostic tests on all of the memory in a memory array even upon the identification of a malfunctioning memory cell. If the memory chip 202 has a number of bad or marginal cells, time is wasted testing the entire memory array since the identification of a single malfunctioning cell often makes the memory chip not salable.

Additionally, such a testing process has been found to be very time consuming, especially in the retesting of previously identified bad memory chips. Bad memory chips 202 are often re-tested to re-evaluate whether a memory chip 202 was mis-identified. Sometimes, memory chips 202 appear to be malfunctioning due to faulty contacts with handlers 200. Thus, a second evaluation of the memory chips 202 that failed the first testing may reveal that some of the memory chips 202 are actually operational. However, even though most of the cells are bad, traditional testing methodologies evaluate all of the memory cells on the memory chip before proceeding to the next chip. This thorough evaluation of all of the memory cells in the memory chip, after identifying some of the cells on the memory chip as malfunctioning, wastes time.

Therefore, memory chip manufacturers are in need of a testing process and system which would test memory chips in an efficient and cost effective manner.

SUMMARY OF THE INVENTION

The invention includes a system for efficiently testing and diagnosing memory arrays. One embodiment of the testing system calculates an efficient testing size for a specified number of rows in a memory array. The testing system efficiently identifies faulty memory cells, and subsequently identifies the memory chip containing the faulty memory cells so it can be removed from the testing process.

Another embodiment of the invention includes a testing system for diagnosing the functionality of memory chips, comprising a chip handler which processes at least one memory chip, and a tester connected to the handler, wherein the tester performs a plurality of diagnostic routines on the at least one memory chip, including performing tests on a subset of memory to identify a malfunctioning memory cell, and halting the testing process in response to the identification of a malfunctioning memory cell.

Another embodiment of the invention includes a chip testing system, comprising a handler configured to hold at least one memory chip, a testing computer connected to the handler, an active parts list residing on the testing computer, wherein the active parts list includes an identifier of the at least one memory chip that has not failed a memory test, and a testing module having at least one diagnostic routine, wherein the testing module removes the at least one memory chip from the active parts list in response to the identification of a faulty memory cell on the memory chip.

Another embodiment of the invention includes computer, comprising a memory chip having been tested by an iterative process comprising evaluating a subset of memory on the memory chip, performing at least one test on the subset of memory to identify a malfunctioning memory cell, and halting the testing process in response to the identification of a malfunctioning memory cell.

DETAILED DESCRIPTION OF THE INVENTION

The following detailed description is directed to certain specific embodiments of the invention. However, the invention can be embodied in a multitude of different ways as defined and covered by the claims. In this description, reference is made to the drawings wherein like parts are designated with like numerals throughout.

System Overview

Figure 1A:
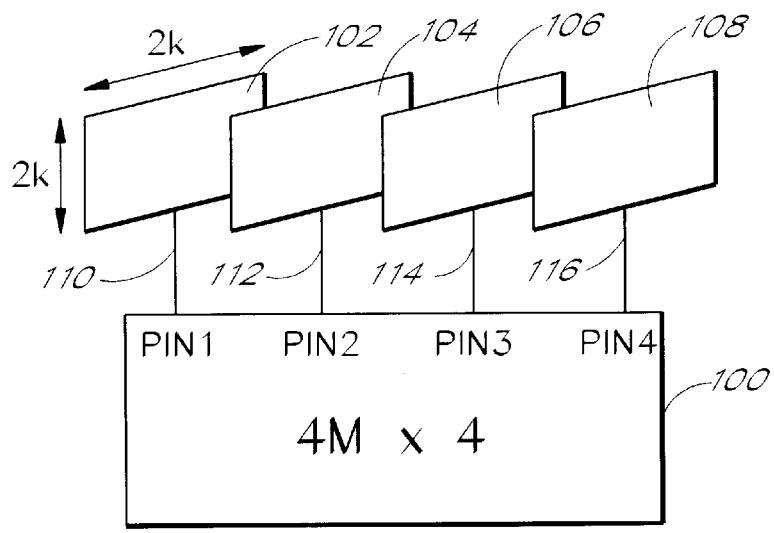
FIGS. 1a and 1b are high level block diagrams illustrating the internals of traditional memory chips.
Figure 1B:
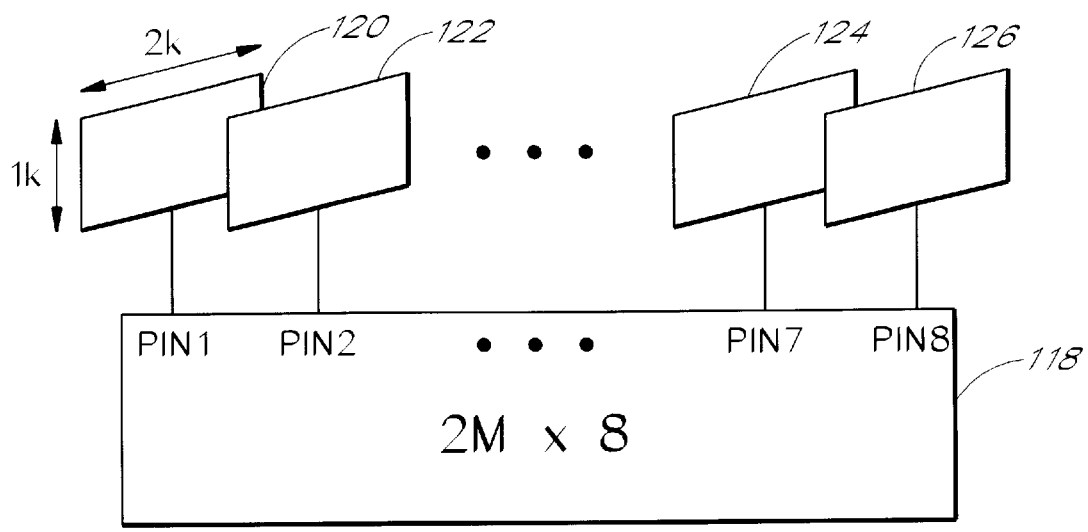
Figure 2:
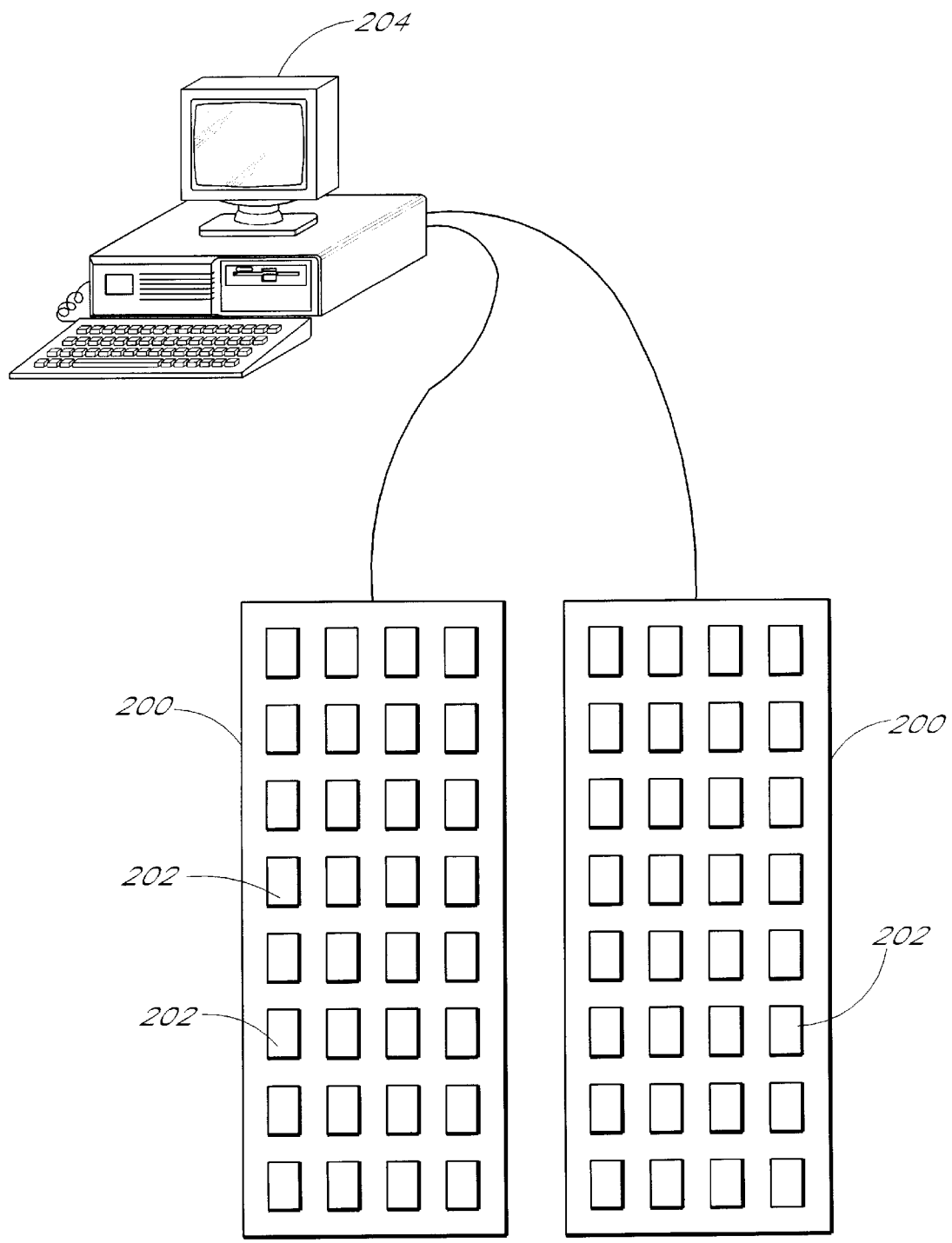
FIG. 2 is a diagram illustrating two traditional memory chip handlers connected to a testing, computer.
Figure 3:
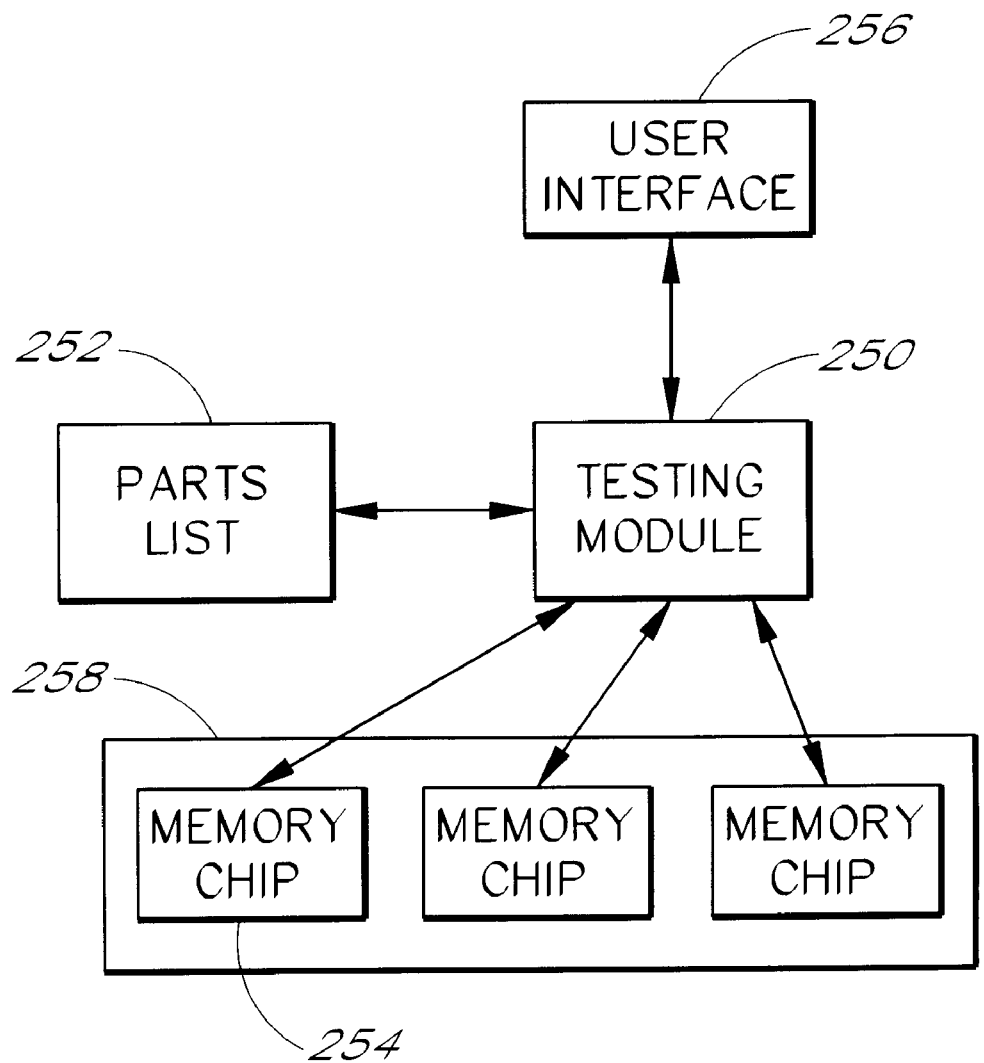
FIG. 3 is a high level block diagram illustrating the components of the testing system.

Referring to FIG. 3, a testing module 250 is shown connected to an active parts list 252. The active parts list 252 is a data structure that may reside in a system memory. The data structure may be in the form of an array, a linked list, or a type of hash table. The active parts list 252 contains an identifier for each of a plurality of memory chips 254 that are to be tested. The testing module 250 is also in communication with a user interface 256. The user interface 256 displays the testing options available to the user, displays the status of the testing process to the user, and receives input to modify the testing algorithms.

In one embodiment of the invention illustrated in FIG. 3, the memory chips 254 are situated on a commercial memory chip handler 258. An example of a commercial memory chip handler is the Atrium M4300 by Simtek. However, as can be readily appreciated by one in the art, the memory chips 254 can be located on various types of devices, so long as a communication pathway exists between the testing module 250 and the memory chips 254.

The testing module 250 may be implemented using a variety of programming languages including: C, C++, BASIC, COBOL, FORTRAN, Pascal, and Assembly Language. Moreover, the testing module 250 may be executed on any conventional general purpose single- or multi-chip microprocessor such as a Pentium® processor, a Pentium Pro® processor, a 8051 processor, a MIPS® processor, a Power PC®, or an ALPHA® processor. In addition, the microprocessor may be any conventional special purpose microprocessor such as a digital signal processor.

Mode of Operation

The testing module 250 provides for the testing of the memory chips 254 through a series of iterations, testing an increasingly larger subset of memory on the memory chips 254 during each pass. On a first iteration or pass, the testing module 250 tests an initial small optimal subset of a memory array of the memory chips 254. An iteration or pass is defined as a completion of the functionality and performance tests that are run on a set of memory cells. Memory chips 254 that fail the test on the first pass are removed from the active parts list 252, since these memory chips 254 have memory cells that are malfunctioning. The testing module 250 then executes an algorithm to determine the best optimal size of the remaining memory on the memory chips to be tested on the next pass.

The testing module 250 then again tests each of the non-failing memory chips 254 using the new optimal size of memory to test. The testing module 250 removes the failing memory chips 254 identified through this second run from the parts list 252 of sites to be tested on the next pass. This procedure is repeated until the testing module 250 tests all of the memory chips 254. This procedure allows the memory chips 254 that have few operational memory cells to be tested more quickly than memory chips 254 having more operational memory. Thus, the memory chips 254 having entirely operational memory arrays take the longest to test.

Figure 4:
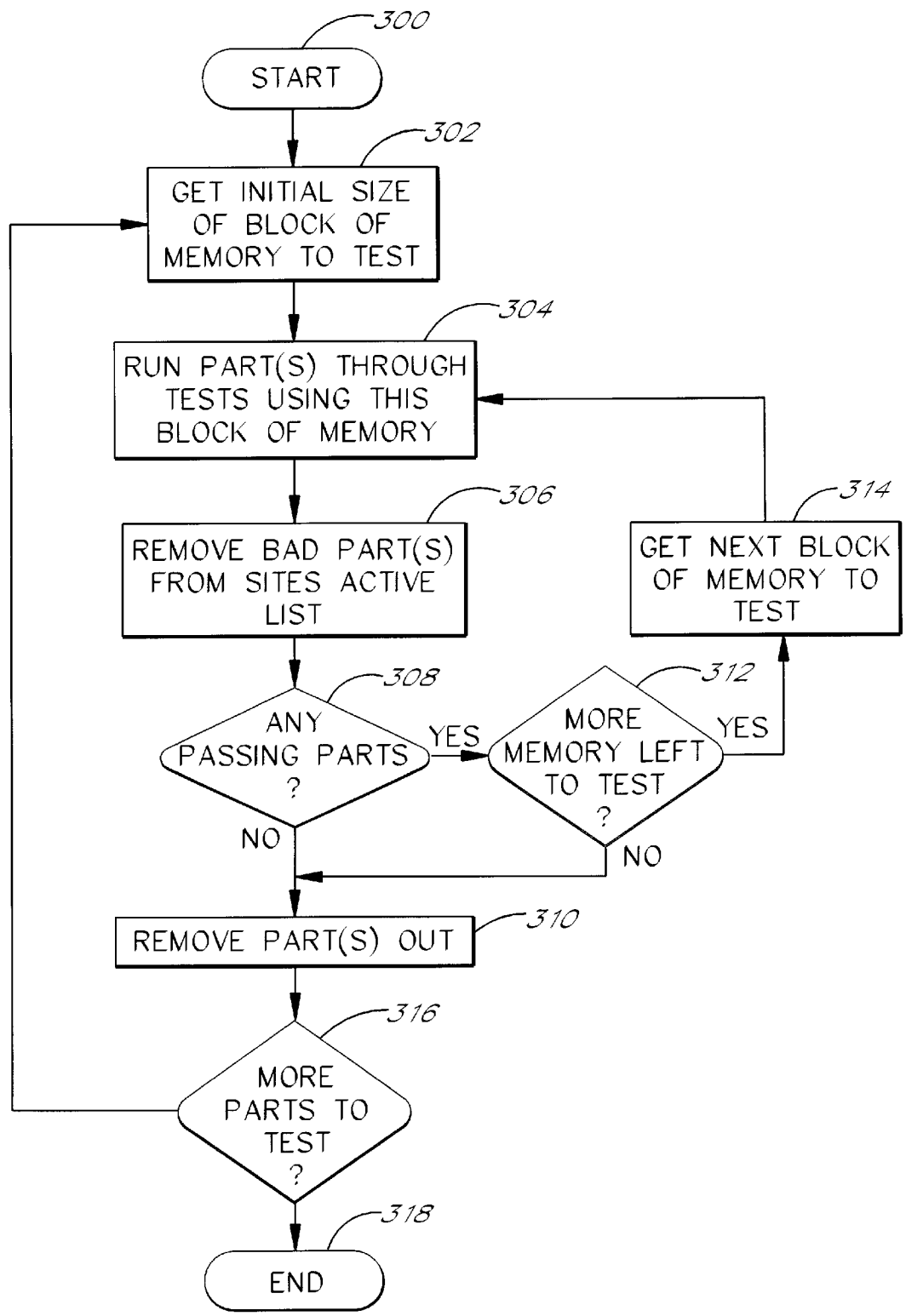
FIG. 4 is a flowchart illustrating the testing process for the testing system shown in FIG. 3.

FIG. 4 is a flowchart illustrating the testing process. Starting at a state 300, the testing module 250 sets up the initial variables and counters. Moving to a state 302, the testing module 250 determines the initial size of the block of memory that is to be tested. The initial size of memory depends on the number of rows and columns in each memory array. As can be readily appreciated by one in the art, the size of the set of test cells may vary. In one embodiment of the invention, the size of the memory tested during each pass is increased exponentially. In an alternative embodiment of the invention, the memory cells on each of the memory chips 254 are tested in sequential order until a malfunctioning memory cell is identified.

Proceeding to a state 304, the testing module 250 performs a series of diagnostic routines on the memory cells. Typical diagnostic routines that are performed on the memory chips 254 may test the following parameters of each the memory chips 254: operable voltages, operable currents, speed, and refresh conditions. Further, each of these parameters can be tested by various methods. For example, a speed test can address the memory arrays by writing to columns, rows, diagonal, or specified bits of the memory array. As can be readily appreciated by one in the art, any of the various conventional diagnostic or testing routines may be used in connection with the testing methodology described herein.

Next, at a state 306, the testing module 250 removes the memory chips 254 that have bad memory arrays from the active parts list 252. The active parts list 252 contains the identifiers of a set of memory chips 202 in which the testing module 250 has not identified any malfunctioning memory cells.

It is noted that the testing module 250 may be configured to allow a predefined number of defective memory cells to be located on a dysfunctional memory chip before the memory chip is removed from the testing process. This predefined number or threshold value advantageously allows a manufacturer to determine if the memory chip contains enough operational memory cells to be partially usable. For example, a two megabyte memory chip with one megabyte of operational memory cells may be configured and sold as a one megabyte memory chip.

The threshold value may be inputted by a user at the beginning of the operation of the testing module 250. Alternatively, the testing module 250 may display the total number of defective memory cells at the end of the testing process, and thereby afford the user the option to keep or discard the partially dysfunctional memory chip.

Proceeding to a decision state 308, the testing module 250 analyzes the active parts list 252 to see if any memory chips 254 passed the diagnostic tests. If none of the memory chips 254 passed the tests, the testing module 250 proceeds to a state 310 which is described below. Otherwise, the testing module 250 proceeds to a state 312 to check whether any memory remains untested. If any of the memory cells remains untested, the testing module 250 moves to state 314 and retrieves the next block of memory. The testing module 250 then returns to a state 304 to start testing a new block of memory. If it is determined in state 312 that all of the memory has been tested, the testing module 250 proceeds to state 310.

In the state 310, the testing module 250 identifies to a user a listing of the faulty memory chips 254, and allows the user to remove these faulty memory chips 254. Next, at a decision state 316, the testing module 250 determines whether there are more memory chips 254 that are in need of testing. If a tester has additional memory chips 254, the testing module 250 moves to a state 302 to repeat the testing process described above. Otherwise, if the tests are complete, the testing module 250 moves to a state 318 and displays the final testing results to the user. Next, in a state 320 the testing module 250 ends.

The following equations 1–7 illustrate the algorithm or pseudo-code employed by one embodiment of the invention to selectively test portions of the memory chips 254. It should be noted that the equations 1–7 may be easily modified to evaluate memory arrays by columns instead of rows. Additionally, the equations 1–7 may be modified to evaluate selected sections of each of the memory chips 254. The equations 1–7 are executed for each memory array on each of the memory chips 254 that is located on a handler 258 or on a general purpose computer (not shown). The text following the equations further describes the purpose of each of the equations as well indicating when the equations are performed in reference to the flowchart shown in FIG. 4.

$$\text{LOWER\_LIMIT}=0; \quad (1)$$

$$\text{UPPER\_LIMIT}=0; \quad (2)$$

$$\text{FOR}(i=0 \text{ to } (LOG_2N-1))\{ \quad (3)$$

$$\text{UPPER\_LIMIT}=2^i; \quad (4)$$

$$\text{EVALUATE(LOWER\_LIMIT, UPPER\_LIMIT)}; \quad (5)$$

$$\text{LOWER\_LIMIT}=\text{UPPER\_LIMIT}+1; \quad (6)$$

$$i\text{++};\} \quad (7)$$

The testing module 250 uses equations 1 and 2 to set the variables LOWER_LIMIT and UPPER LIMIT to zero. LOWER_LIMIT represents the starting row of the memory array that is to be tested during a pass. UPPER LIMIT represents the last row of memory that is to be tested during the pass. The testing module 250 performs equations 1 and 2 at the state 300 shown in FIG. 3.

Moving to equation 3, the testing module 250 initializes a looping variable i. The testing module 250 uses the variable i to calculate the row numbers of the memory cells that are to be tested for each pass of the testing process. The testing module 250 sets the variable N to the number of rows of memory cells in the memory chips 254. Next, at equation 4 the testing module 250 sets the UPPER_LIMIT to be equal to the function $2^i$ in order to exponentially increase the size of the memory cells that are to be tested. However, as was previously mentioned, the size of the test set of cells may vary. An alternative embodiment of the invention linearly increases the size of the set of test cells. The equations 3 and 4 are executed in the state 302 shown in FIG. 3.

Proceeding to use equation 5, the testing module 250 performs the diagnostic tests on each of the memory chips 254. Referring to FIG. 3, the testing module 250 runs the series of diagnostic tests on the memory cells (state 304), and removes bad memory chips 254 from the active parts list 252 (state 306). If no passing memory chips 254 are found, the testing module 250 stops analyzing the memory chips 254 (state 310).

Next, using equation 6 the testing module 250 resets the LOWER_LIMIT to equal the UPPER_LIMIT+1 in preparation for repeating the testing process on a new set of rows. Referring to FIG. 3, equation 6 is performed at the decision state 312. Moving to equation 7, the looping variable i is incremented by one in the decision state 312.

The testing module 250 then returns to equation 3 to determine whether the all of the rows have been tested this is done in the decision state 312. If some of the rows of memory have not been tested, the testing module 250 recalculates an UPPER_LIMIT and repeats the diagnostic routines on the untested memory rows. Otherwise, the testing module 250 determines in the state 316 whether there are more memory chips 254 that are in need of testing.

Table 1 illustrates the state of the variables in equations 1–7 during the testing process for the embodiment disclosed above. Table 1 illustrates the different values for the variables LOWER_LIMIT and UPPER_LIMIT depending on the current iteration of the looping variable i for a memory array with 64 rows.

TABLE 1

| i | LOWER_LIMIT | UPPER_LIMIT | EVALUATED ROWS |
|---|---|---|---|
| 0 | 0 | 1 | 0, 1 |
| 1 | 2 | 3 | 2, 3 |
| 2 | 4 | 7 | 4–7 |
| 3 | 8 | 15 | 8–15 |
| 4 | 16 | 31 | 16–31 |
| 5 | 32 | 63 | 32–63 |

As can be seen from Table 1, during each pass of the testing process, increasing sizes of memory are analyzed. In the first pass only two rows are analyzed, while in the fifth pass thirty-two rows are analyzed.

Using this testing system, memory chips having memory cells that have large numbers of dysfunctional memory cells are likely to be identified on the first several passes, and then be removed from the active parts list 252. The first pass runs quickly, since the testing module 250 only tests a small portion of the memory, and there is no wasted time testing the rest of the memory array. On the second pass, the testing module 250 tests a new portion of the remaining memory chips 254 based upon an algorithm, such as is disclosed in Equation 4, that increases the size of the memory to be tested upon each pass. Since the setup time to run a pass is small, the time to test the memory chips 254 with operational memory using this procedure is approximately equal to the time it takes to test the memory chips 254 having all operational memory using a traditional procedure. Thus, at its slowest, the system is as fast as the prior art systems disclosed herein. Furthermore, the more inoperable or partially operable memory cells that are in a set of memory chips 254, the quicker the memory chips 254 are tested.

The testing module 250 disclosed herein overcomes the long-standing problem in the industry of long testing times by providing efficient and cost effective procedures and processes for identifying malfunctioning memory chips 254. The testing module 250 dramatically decreases the testing time of memory chips 254 by only testing each of the memory chips 254 until the presence of an inoperable memory cell is identified.

While the above detailed description has shown, described, and pointed out fundamental novel features of the invention as applied to various embodiments, it will be understood that various omissions and substitutions and changes in the form and details of the system illustrated by be made by those skilled in the art, without departing from the intent of the invention. Thus, the scope of the invention is indicated by the appended claims rather than by the foregoing description. All changes which come within the meaning and range of equivalency of the claims are to be embraced within their scope.

What is claimed is:

1. A system for diagnosing the functionality of memory chips, comprising:
    a chip handler which processes at least one memory chip; and
    a tester connected to the handler, wherein the tester performs a plurality of diagnostic routines on the at least one memory chip, including:
        performing tests on a subset of memory to identify a malfunctioning memory cell;
        removing a malfunctioning memory chip from the testing process upon the identification of at least one malfunctioning memory cell in the subset of memory; and
        testing a new subset of memory, wherein the size of the new subset of memory is greater in number than the original subset.

2. The system of claim 1, wherein the tester performs tests on a new subset of memory if the previous subset of memory is determined to be operational.

3. The system of claim 1, wherein the chip handler processes a plurality of memory chips, and the tester performs the series of diagnostic routines on the plurality of memory chips.

4. A chip testing system, comprising:
    a handler configured to hold at least one memory chip;
    a testing computer connected to the handler;
    an active parts list residing on the testing computer, wherein the active parts list includes an identifier of the at least one memory chip that has not failed a memory test; and
    a testing module having at least one diagnostic routine that performs tests on a subset of memory to identify a malfunctioning memory cell, wherein the testing module removes the at least one memory chip from the active parts list in response to the identification of a faulty memory cell in the subset of memory and wherein the testing module performs the at least one diagnostic routine in a plurality of passes and wherein the amount of cells tested during each pass is greater in number than the previous pass.

5. The testing system defined in claim 4, wherein the chip testing system is a Mongoose J994.

6. The chip testing system as defined in claim 4, wherein the testing module performs the at least one diagnostic routine in a plurality of passes and wherein the amount of cells tested during each pass is double in number than the previous pass.

7. The chip testing system as defined in claim 4, wherein the at least one diagnostic routine includes a speed test.

8. The chip testing system as defined in claim 4, wherein the at least one diagnostic routine includes a current test.

9. A computer, comprising:
    a memory chip having been tested by an iterative process comprising:
        evaluating a subset of memory on the memory chip;
        performing at least one test on the subset of memory to identify a malfunctioning memory cell, wherein the at least one test diagnoses increasingly larger numbers of memory during each iteration of the testing process; and
        removing a malfunctioning memory chip from the testing process upon the identification of at least one malfunctioning memory cell in the subset of memory.

10. The computer of claim 9, wherein the iterative process performs the at least one test on a new subset of memory if the previous set of memory is determined to be operational.

11. The computer as defined in claim 9, wherein the at least one test doubles the size of the memory that is tested during each iteration of the testing process.

12. The computer as defined in claim 9, wherein the at least one test includes a speed test.

13. The computer as defined in claim 9, wherein the at least one test includes a current test.

14. A system for testing a plurality of memory chips, comprising:
    means for evaluating a subset of memory on one of the plurality of memory chips;
    means for performing diagnostic tests on the subset of memory to identify whether it is malfunctioning;
    means for removing a malfunctioning memory chip from the testing process upon identifying that at least a portion of the subset of memory is malfunctioning; and
    means for repeating the testing process on a new set of memory until the operational status of each of the plurality of memory chips is identified, wherein the new set of memory is greater in size than the size of the original subset of memory.

15. The system as defined in claim 14, further comprising a memory chip handler which enables the testing of a new set of memory chips.

16. The system as defined in claim 14, wherein the new set of memory is double in size over the size of the original subset of memory.

17. The system as defined in claim 14, wherein the means for performing diagnostic tests includes means for performing a speed test.

18. The system as defined in claim 14, wherein the means for performing diagnostic tests includes means for performing a current test.

19. The system as defined in claim 14, further comprising means for providing an active list to maintain the identifiers of the memory chips that have successfully completed the diagnostic tests.

20. A program storage device storing instructions that when executed by a computer perform the method comprising:
    evaluating a subset of memory on one of a plurality of memory chips;
    performing diagnostic tests on the subset of memory to identify whether the subset is malfunctioning;
    removing a malfunctioning memory chip from the testing process upon identifying that at least a portion of the subset of memory is malfunctioning; and
    repeating the testing process on a new set of memory until the operational status of each of the plurality of memory chips is identified, wherein the new set of memory is greater in size than the size of the original subset of memory.

* * * * *

UNITED STATES PATENT AND TRADEMARK OFFICE
CERTIFICATE OF CORRECTION

PATENT NO. : 6,058,055

DATED : May 2, 2000

INVENTOR(S): Brunelle

It is certified that error appears in the above-identified patent and that said Letters Patent is hereby corrected as shown below:

At [73], please delete "Boise" and insert therefore --Nampa--.

*Signed and Sealed this*

Twenty-second Day of May, 2001

*Attest:*

NICHOLAS P. GODICI

*Attesting Officer*  *Acting Director of the United States Patent and Trademark Office*